(12) United States Patent
Kong et al.

(10) Patent No.: US 10,359,871 B2
(45) Date of Patent: Jul. 23, 2019

(54) DISPLAY PANEL AND METHOD OF MANUFACTURING THE SAME

(71) Applicant: LG DISPLAY CO., LTD., Seoul (KR)

(72) Inventors: Sunbae Kong, Goyang-si (KR); JeongKweon Park, Paju-si (KR); Chan Park, Goyang-si (KR); KyengBaek Ryu, Paju-si (KR); Heungju Jo, Chungju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/836,430

(22) Filed: Aug. 26, 2015

(65) Prior Publication Data

US 2016/0092011 A1 Mar. 31, 2016

(30) Foreign Application Priority Data

Sep. 26, 2014 (KR) .................. 10-2014-0129282
Feb. 27, 2015 (KR) .................. 10-2015-0028572

(51) Int. Cl.
*H05K 1/00* (2006.01)
*G06F 3/041* (2006.01)
(Continued)

(52) U.S. Cl.
CPC ............ *G06F 3/0412* (2013.01); *G06F 3/044* (2013.01); *G06F 3/045* (2013.01); *H05K 1/097* (2013.01); *H05K 3/1283* (2013.01); *G02F 1/13338* (2013.01); *G02F 2001/136295* (2013.01); *G06F 2203/04103* (2013.01); *G06F 2203/04106* (2013.01); *G06F 2203/04107* (2013.01); *H05K 1/0306* (2013.01); *H05K 1/0393* (2013.01); *H05K 1/092* (2013.01); *H05K 3/125* (2013.01); *H05K 3/282* (2013.01); *H05K 2201/026* (2013.01); *H05K 2201/0323* (2013.01);
(Continued)

(58) Field of Classification Search
CPC .......................... H05K 1/097; H05K 3/1241
See application file for complete search history.

(56) References Cited

U.S. PATENT DOCUMENTS

2002/0037021 A1* 3/2002 Ohkubo ............... H01S 5/16
372/46.01
2003/0194598 A1* 10/2003 Chan .................. H01M 4/8605
429/524
(Continued)

FOREIGN PATENT DOCUMENTS

CN 101089058 A 12/2007
CN 101452362 A 6/2009
(Continued)

*Primary Examiner* — Robert A Vetere
(74) *Attorney, Agent, or Firm* — Dentons US LLP

(57) ABSTRACT

Provided is a display panel including a loop-shaped conductive path which is manufactured by performing a conductive ink jetting process and a high-degree vacuum removal process to effectively vaporizing a solvent in a conductive ink line at lower temperature than the boiling point at atmospheric pressure of the solvent. The conductive path manufactured as such does not allow a stain or a trace, such as a pull-back region, to be left around the conductive path. Thus, it is possible to obtain the loop-shaped conductive path having an initially intended design without being damaged during a process.

21 Claims, 9 Drawing Sheets

(51) Int. Cl.
*G06F 3/044* (2006.01)
*G06F 3/045* (2006.01)
*H05K 1/09* (2006.01)
*H05K 3/12* (2006.01)
*H05K 1/03* (2006.01)
*H05K 3/28* (2006.01)
*G02F 1/1333* (2006.01)
*G02F 1/1362* (2006.01)

(52) U.S. Cl.
CPC ............. *H05K 2201/0326* (2013.01); *H05K 2201/098* (2013.01); *H05K 2201/10128* (2013.01); *H05K 2203/0514* (2013.01); *H05K 2203/085* (2013.01)

(56) References Cited

U.S. PATENT DOCUMENTS

| | | | | |
|---|---|---|---|---|
| 2005/0026410 | A1* | 2/2005 | Yamazaki | G02F 1/136227 438/597 |
| 2005/0147737 | A1* | 7/2005 | Shinkai | H05K 3/125 427/58 |
| 2007/0188079 | A1* | 8/2007 | Song | H01L 51/5246 313/504 |
| 2007/0215393 | A1* | 9/2007 | Voss-Kehl | B82Y 30/00 178/18.01 |
| 2007/0289483 | A1* | 12/2007 | Cho | C09D 11/322 106/31.13 |
| 2008/0083927 | A1* | 4/2008 | Nishiura | G02F 1/136227 257/72 |
| 2011/0279401 | A1* | 11/2011 | Hong | G06F 3/044 345/174 |
| 2014/0034921 | A1* | 2/2014 | Jinta | H01L 51/5012 257/40 |
| 2014/0184989 | A1* | 7/2014 | Park | G02F 1/13306 349/84 |

FOREIGN PATENT DOCUMENTS

| | | |
|---|---|---|
| CN | 102214042 A | 10/2011 |
| CN | 202694316 U | 1/2013 |

* cited by examiner

DISPLAY PANEL AND METHOD OF MANUFACTURING THE SAME

This application claims the priority of Korean Patent Application Nos. 10-2014-0129282 filed on Sep. 26, 2014 and 10-2015-0028572 filed on Feb. 27, 2015, in the Korean Intellectual Property Office, the disclosures of which are incorporated herein by reference for all purposes as if fully set forth herein.

BACKGROUND OF THE INVENTION

Field of the Invention

The present invention relates to a display device and a method for manufacturing the same, and more particularly, to a display device including a conductive path and a method for manufacturing the same.

Discussion of the Related Art

A method for forming a metal wire having a continuous and integrated loop shape includes the use of a metallic ink and performing inkjet printing. Using the inkjet printing, a conductive pattern can be formed on a substrate by adjusting a position, a moving speed, and a jet velocity of a nozzle that dispenses the metallic ink.

However, a solvent needs to be removed to solidify the metallic ink on the substrate, and this process may take a long time. Also, an undesirable amount of metal may be lost while solidifying the metallic ink or metal particles in the metallic ink may undesirably move around when the solvent evaporates to dry and to solidify the metallic ink, making it difficult to form the conductive path in a desired shape.

SUMMARY OF THE INVENTION

Accordingly, the present invention is directed to provide a display device and method of manufacturing the same that substantially obviates one or more problems due to limitations and disadvantages of the related art.

An advantage of the present invention is directed to provide a display device including a conductive path formed by an inkjet printing with improved stability.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display device may, for example, include a display panel including a light controlling material between a lower substrate and an upper substrate; a TFT layer on an upper surface of the lower substrate; and an inkjet-printed metal pattern on a lower surface of the lower substrate, the inkjet-printed metal pattern having substantially uniform thickness and width and serving as a conductive path in the display panel, wherein the inkjet-printed metal pattern is cured at a temperature in consideration of substantially preventing deterioration or degeneration of the light controlling material.

In another aspect of the present invention, a display device with at least two different types of touch sensors may, for example, include a loop shape conductive path covered by an insulating protective layer which exposes a part of the loop shape conductive path; and an transparent conductive layer directly contact with the loop shape conductive path at a boundary thereof, wherein the loop shape conductive path and the transparent conductive layer are in between at least one touch electrode of one among the at least two types of touch sensors and at least one touch electrode of another among the at least two types of touch sensors, respectively.

In yet another aspect of the present invention, a method for manufacturing a display device having an active area and an inactive area may, for example, include providing an ink material having conductive particles dispersed in a solvent on a substrate in the inactive area, surrounding the active area; forming a conductive path by removing the solvent from the ink material in a vacuum condition at a temperature that is lower than 130° C.; and forming a protective layer on the conductive path.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
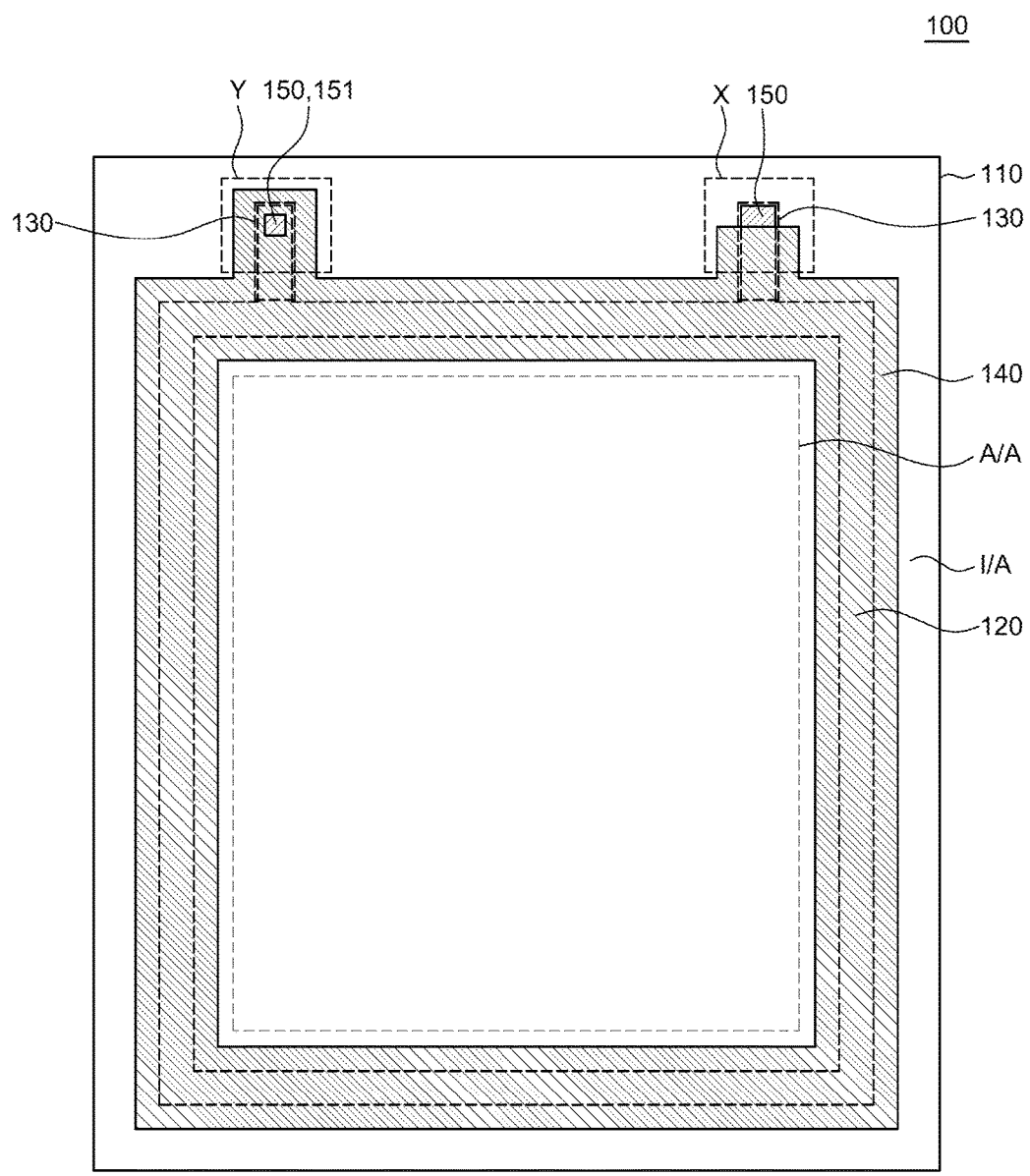
FIG. 1 is a plane view of a display panel including a conductive path and a protective layer according to an exemplary embodiment of the present invention.

Advantages and features of the present invention, and methods for accomplishing the same will be more clearly understood from exemplary embodiments described below with reference to the accompanying drawings. However, the present invention is not limited to the exemplary embodiments but may be described in the present disclosure. The exemplary embodiments are provided only to complete disclosure of the present invention and to fully provide a person having ordinary skill in the art to which the present invention pertains with the category of the invention, and the present invention will be defined by the appended claims.

The shapes, sizes, ratios, angles, numbers, and the like illustrated in the accompanying drawings for describing the exemplary embodiments of the present invention are merely examples, and the present invention is not limited thereto.

Like reference numerals generally denote like elements throughout the present specification.

In the following description, a detailed explanation of known related technologies may be omitted to avoid unnecessarily obscuring the subject matter of the present disclosure.

The terms such as "including," "having," and "consist of" used herein are generally intended to allow other components to be added unless the terms are used with the term "only".

Any references to singular may include plural unless expressly stated otherwise.

Components are interpreted to include an ordinary error range even if not expressly stated.

When the position relation between two parts is described using the terms such as "on", "above", "below", "next" and the like, one or more parts may be positioned between the two parts unless the terms are used with the term "immediately" or "directly" is not used.

Although the terms "first", "second", and the like are used for describing various components, these components are not confined by these terms. These terms are merely used for distinguishing one component from the other components. Therefore, a first component to be mentioned below may be a second component in a technical concept of the present invention.

The terms, such as first, second, A, B, (a), or (b) may be used herein when describing components of the present invention. Each of these terminologies is not used to define an essence, order, sequence, the number of a corresponding component but used merely to distinguish the corresponding component from other component(s). It should be noted that if it is described in the specification that one component is "connected," "coupled" or "joined" to another component, a third component may be "connected," "coupled," and "joined" between the first and second components, although the first component may be directly connected, coupled or joined to the second component.

In the present invention, the term "loop-shaped conductive path" may be a conductive path that includes a conductive line that runs in a closed-loop. The closed-loop can be in a circular shape, an oval shape, a rectangular shape, a square shape, a diamond shape, a trapezoidal shape, or even in an amorphous shape. It should be noted that the loop-shaped conductive path may further includes a conductive line portion, which extends out from the continuous loop portion of the conductive line.

The entire conductive line forming the loop-shaped conductive path is formed from the same metallic ink using the same process, and thus the entire conductive line of the loop-shaped conductive path is integrated into a single-piece seamless conductive line. In other words, current can flow between any two points of the loop-shaped conductive path without any interconnecting element.

The features described in various embodiments of the present disclosure can be, partially or entirely, combined with each other.

FIG. 1 is a plane view of a display panel including a conductive path and a protective layer according to an exemplary embodiment of the present invention.

Referring to FIG. 1, a display panel 100 according to the exemplary embodiment of the present invention includes a substrate 110, an active area A/A, an inactive area I/A, a conductive path 120, an extension portion 130, a protective layer 140, a hole 151, and a connector portion 150.

The display panel 100 according to the exemplary embodiment of the present invention includes an active area A/A and an inactive area I/A adjacent to the active area A/A. The active area A/A refers to an area where an image (or other visual output) is actually displayed on the display panel, and the inactive area I/A refers to an area other than the area where an image (or other visual output) is actually displayed on the display panel. The inactive area I/A may be provided at one or more sides of the active area A/A. Also, the inactive area I/A may be positioned around the active area A/A so as to surround the active area A/A. For instance, the active area A/A may be provided in a round shape, and the inactive area I/A may have a closed loop shape of a ring that surrounds the active area A/A.

The components included in the display panel 100 are arranged on the substrate 110, and the substrate 110 is configured to support a shape of the display panel 100. That is, the substrate 110 serves as a basic frame for the display panel 100. The substrate 110 may be fixed in a flat state or fixed in a bent or curved state, or may be provided with some degree of flexibility so that the display panel 100 can be provided as a flexible display. Further, the substrate 110 may be formed of a glass or a plastic-based polymer material. The substrate 110 may be transparent or translucent.

The loop-shaped conductive path 120 includes a closed-loop portion. That is, at least a part of the loop-shaped conductive path 120 is provided as a closed-loop, such as a ring. As depicted in FIG. 1, the loop-shaped conductive path 120 may further includes a number of extension portions 130 that extend out from the closed-loop portion of the loop-shaped conductive path 120. The closed-loop portion and the extension portions 130 are integrated into a continuous seamless loop-shaped conductive path 120 without any portions being arranged to overlap one another or a separate element interconnecting any portions.

The conductive path 120 may be arranged or located in the inactive area I/A. As such, in some embodiments, the conductive path 120 may surround the active area A/A of the substrate 110 as illustrated in FIG. 1. For example, the conductive path 120 may be arranged such that a closed-loop portion of the conductive path 120 surrounds (or encloses) the active area A/A.

The loop-shaped conductive path 120 may be formed on the substrate by ink-jetting (or otherwise outputting) a conductive metallic ink onto the substrate 110 into a desired design. To be more specific, the conductive path 120 is manufactured by ink jetting the conductive ink, removing a solvent in the conductive ink to maintain a shape thereof, and performing a hardening process (e.g., a photonic sintering process). Herein, an inkjet printing method is described by way of example as a method for providing a conductive ink into a desired design. Herein, a hardening process may be a sintering process using heat energy, light energy, etc. and an exemplary sintering process may be a photonic sintering process using a xenon lamp that emits fluorescent-light pulses for a few minutes.

Herein, the term "conductive ink" refers to a kind of paste-state composition in which conductive particles are dispersed in a polar organic material, and maintained in a liquid state at a room temperature. The conductive particles can be a highly-conductive metallic material such as silver (Ag), copper (Cu), chromium (Cr), and the like or an alloy of such or similar materials. The conductive particles may be dispersed in a solvent to form a conductive ink, which is maintained in a liquid state at a room temperature.

The conductive ink further includes a dispersant that promotes dispersion of the conductive particles. For example, the conductive ink includes a polar organic material having polarity as a solvent, and the conductive particles are dispersed in the polar organic solvent, which is maintained in a liquid state at a room temperature. The solvent of the conductive ink may be a polar organic solvent with an alcohol functional group, such as Triethylene Glycol Monoethyl Ether (TGME). However, it should be appreciated that a non-polar organic material can be used as a solvent of the conductive ink depending on, for example, the properties of the conductive particles and the dispersant according to the principles of the present invention.

The polar organic solvent may have the boiling point of 130° C. in a pressure between the atmospheric pressure and a pressure at the triple point of the polar organic solvent. In addition to the polar organic material, the conductive ink may also include a viscous organic material to adjust the viscosity of the conductive ink and to adjust the spread of the conductive ink after it is jetted or provided onto the surface of the substrate 110.

In this regard, the viscosity of the conductive ink should be sufficiently low so that the conductive ink can be used with the inkjet printing method. At the same time, the viscosity of the conductive ink should be sufficiently high so that it can be properly jetted or provided onto the targeted region of the substrate 110 in a controlled manner. In other words, the conductive ink should be able to maintain its shape once it is jetted or provided onto the surface of the substrate 110. The viscous organic material in the conductive ink can also help in improving adherence of the resulting conductive path 120 onto the targeted surface. In particular, the viscous organic material can increase the adhesive strength of the conductive path 120 after the polar organic solvent is removed from the conductive ink and the hardening or sintering process is performed.

The polar organic material can be removed from the conductive ink by evaporation in the atmosphere, but removing the polar organic material only through natural evaporation takes an undesirably long time. As such, an active vaporization process (e.g., a boiling process) should be carried out to remove the polar organic material in a short time. However, the active vaporization process should be performed under a temperature that would not damage the components of the display panel. For instance, organic light emitting diodes, liquid crystals or any light controlling materials in the display panel can be damaged when they are exposed in a high temperature environment (e.g., above 130° C.). If the boiling point where the removing the polar organic material as a solvent occurs is equal to or higher than the temperature at which the display panel may become defective because of deterioration or degeneration of the light controlling materials, the polar organic material may not be sufficiently removed from the resulting conductive path 120.

In order to minimize the display panel defective, the boiling point of the polar organic material included in the conductive ink during the removing the polar organic solvent material may not be higher than the temperature at which the display panel may become defective. Or, in order to minimize the display panel defective, the boiling point of the polar organic material included in the conductive ink during the removing the polar organic solvent material may be lowered under the temperature that the display panel become defective. In this regard, it is beneficial to use an organic material such as TGMA as a solvent of the conductive ink, which has a boiling point that is lower than the temperature at which degradation or degeneration of the light controlling materials may occur.

In order to lower the boiling point of the polar organic material, the removal process of the polar organic material can be performed in a vacuum environment. It should be noted that the vacuum environment in which the removal process is performed is not necessarily an absolute vacuum environment. It is sufficient that the vacuum environment is capable of lowering the boiling point of the polar organic material below the temperature in which the display panel may be damaged. By way of example, the removal process of the polar organic material from the conductive ink can be performed in a high-degree vacuum environment in which the boiling point of the polar organic material becomes equal to or lower than 130° C. To be more specific, the pressure can be reduced such that the boiling point of the polar organic material becomes lower than a temperature that would cause a defect in the display panel (e.g., about 130° C.). The high-degree vacuum environment refers to a pressure range of $10^{-2}$ Pa~$10^{-5}$ Pa that can be achieved by implementation of a turbo molecular or cryo pump. In this way, the solvent of the conductive ink can undergo a phase transition from liquid to gas without causing any damage to the components of the display panel.

Furthermore, faster removal of the polar organic material can be achieved by extracting (or evacuating) the polar organic material vaporized into gas. Rapid removal of the polar organic material from the conductive ink achieved by a high-degree vacuum removal process may allow formation of the conductive path in a precise manner without pull-back regions. More specifically, rapid removal of the polar organic solvent from the conductive ink can limit movement of the conductive particles that may create the pull-back regions from the region where the conductive ink was initially jetted.

Most of the polar organic material can be removed from the conductive ink by the high-degree vacuum removal process. However, it should be noted that a very small amount of the polar organic material may still remain in the conductive path 120 even in the fully manufactured display panel. Accordingly, the remaining polar organic material after the high-degree vacuum removal process may be undesirably coagulated with the conductive particles in the conductive path 120.

With a small amount of the polar organic material remaining therein, the conductive path 120 is not burnt out during the sintering process. That is, a small amount of the organic solvent may not have any significant effect to sintering of the conductive path 120. Thus, the high-degree vacuum removal process may be ended although a residual amount polar organic material remains in the conductive path 120. Therefore, there exists a residual amount of the polar organic material suitable to analyze whether or not the polar organic material is included and specifically analyze the composition of the polar organic material remaining in the conductive path 120 in between the high-degree vacuum removal process and the sintering process.

Preferably, the boiling point of the viscous organic material may be higher than the boiling point of the polar organic material. This is because the viscous organic material may remain in the conductive path 120 to provide sufficient adhesion even when most of the polar organic material is removed from the conductive path 120 by boiling of the organic solvent in the high-degree vacuum removal process.

The conductive path 120 may include at least one protruded region or branch-like segments, e.g., the extension portion 130, which extends out from the loop portion of the conductive path. The extension portion 130 may stem out from the loop portion of the conductive path 120, and extend toward an edge of the display panel 100. The extension portion 130 may be protrude out of the protective layer 140 (as depicted by the right side extension portion 130 in FIG. 1), or the extension portion 130 may be covered by the protective layer 140 but having a contact hole 151 that exposes a portion of the extension portion 130 (as depicted by the left side extension portion 130), or the extension portion 130 and the protective layer 140 end together at the edge of the display panel 100 (e.g., extend to an edge of the display panel 100). The extension portion 130 is a part of the conductive path 120. Therefore, all the descriptions regarding the properties of the conductive path 120 can be applied to the extension portion 130.

An electrical signal (i.e. current) may be applied to or transferred through the conductive path 120 using the extension portion 130 as a contact terminal or contact pad. For example, an electrical signal may be applied to the conductive path 120 through the extension portion 130 or an electrical signal may be transmitted from the conductive path 120 through the extension portion 130. For example, the conductive path 120 may be grounded through the extension portion 130. Herein, the hole 151 and the connector portion 150, which will described below, may be positioned on an upper surface of the extension portion 130. Although the extension portions 130 in FIG. 1 are illustrated to stop without reaching the edge of the display panel 100, in some embodiments, the extension portions 130 of the conductive path 120 can be extended to the edge of the display panel 100.

The protective layer 140 may be positioned (or placed) in direct contact with the conductive path 120. Herein, a lower surface of the conductive path 120 refers to a surface of the conductive path 120 that is in contact with a surface on which the conductive ink is jetted. An upper surface of the conductive path 120 is not in contact with the surface on which the conductive ink is jetted. Therefore, the lower surface of the conductive path 120 has a flat shape, and the upper surface of the conductive path 120 has a particular shape of, e.g., an inclined shape, which is gradually decreased in thickness from the center toward the edge of the conductive path 120.

The protective layer 140 has a similar design or shape as the conductive path 120 and is configured to cover the upper surface of the conductive path 120. For example, the protective layer 140 has a similar shape as the conductive path 120 but has a width greater than that of the conductive path 120. Further, similar to the conductive path 120, the protective layer 140 may also have a loop shape of a ring or other enclosing structure. Furthermore, similar to the conductive path 120, the protective layer 140 may also be positioned or located in the inactive area I/A. If the protective layer 140 is optically transparent, the protective layer 140 may be formed as a layer disposed over from the active area A/A to the inactive area I/A.

Since the protective layer 140 is configured to cover the conductive path 120, it can have a width greater than that of the conductive path 120 regardless of whether or not the protective layer 140 follows the design of the conductive path 120. As a result, some parts of the protective layer 140 may be in direct contact with a surface on which the conductive ink is jetted without intervention of the conductive path 120 therebetween. Herein, the surface on which the conductive ink is jetted may be the substrate 110 or some conductive layer positioned between the substrate 110 and the conductive path 120, which will be described later. Because the portion of the surface on which the conductive ink is jetted and the protective layer 140 are in direct contact with each other, it is possible to reduce or prevent a loss of the conductive path 120 from the surface on which the conductive ink is jetted.

In order to prevent a loss and support the conductive path 120, the protective layer 140 may include a viscous organic material, which may be the same or different from the viscous organic material used in the conductive ink. Further, in order to insulate the conductive path 120 from the other components, the protective layer 140 may include an insulating material. For example, the protective layer 140 may be a colored or transparent polyimide-based material.

The display panel 100 according to the exemplary embodiment of the present invention may further include a conductive layer that is continuously positioned or located in the active area A/A and the inactive area I/A. The conductive layer may be transparent and formed of any one selected from indium oxide, tin oxide, zinc oxide, indium-tin oxide, indium-zinc oxide, tin-antimony oxide, graphene, carbon nano tube, Ag nano particle, Ag nano wire, a thin metal mesh, or any combination thereof. The conductive layer may be in contact with the upper or lower surface of the conductive path 120. The conductive path 120 may be positioned between the conductive layer and the protective layer 140. Herein, the conductive path 120 may be in direct contact with the conductive layer and the protective layer 140. To be more specific, the lower surface of the conductive path 120 may be in direct contact with the conductive layer and the upper surface of the conductive path 120 may be in direct contact with the protective layer 140.

The conductive path 120 exposed outside the protective layer 140 may serve as the connector portion 150 for electrically connecting the conductive path 120 to other component in the display panel 100. In FIG. 1, part of the extension portion 130 extended out from the loop portion of the conductive path 120 that is exposed outside the protective layer 140 is arranged as the connector portion 150. However, it should be appreciated that any portion of the conductive path 120, which is not covered by the protective layer 140, e.g., an exposed portion of the conductive path 120, can serve as the connector portion 150. In some cases, the portion of the conductive path 120 exposed through a contact hole 151 in the protective layer 140 may be the connector portion 150. Details thereof will be described with reference to FIG. 2 and FIG. 3.

The connector portion 150 may enable the conductive path 120 to be applied with an electrical signal from the outside. Further, the connector portion 150 may enable the conductive path 120 to be electrically connected to the other components of the display panel 100 according to the exemplary embodiment of the present invention. Further, the connector portion 150 may enable a potential of the conductive path 120 to be the same as those of other components included in the display panel 100 according to the exemplary embodiment of the present invention. For example, the connector portion 150 may enable the conductive path 120 to be grounded. Herein, other components included in the display panel 100 according to the exemplary embodiment of the present invention refer to not only the components explicitly described in the present specification, but also to the components which are generally regarded as components of a display panel.

Referring to FIGS. 2 and 3, various applicable arrangements and shapes of the contact hole 151 or the connector portion 150 in the display panel 100 according to the exemplary embodiment of the present invention illustrated in FIG. 1 will be described in more detail.

FIGS. 2 and 3 are a plane view and a side view enlarging an area X of FIG. 1 where the extension portion 130 of the conductive path 120 as illustrated in FIG. 1 is located. The position of the hole 151 or the connector portion 150 in FIG. 1 is provided only for the purpose of illustration, and the position of the hole or the connector portion in FIGS. 2 and 3 is also provided for the purpose of illustration.

Figure 2A:
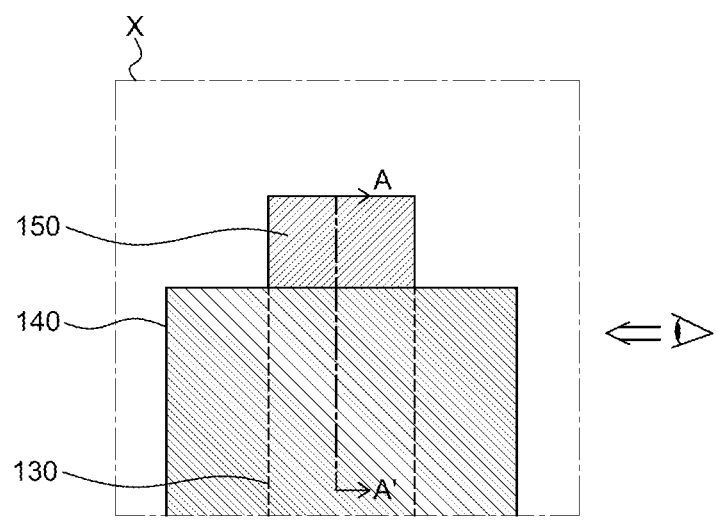
FIG. 2A is a plane view of an area X of FIG. 1.
Figure 2B:
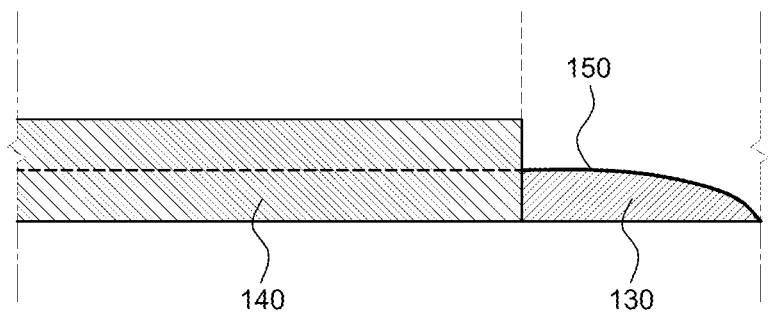
FIG. 2B is a side view of the area X of FIG. 1.
Figure 2C:
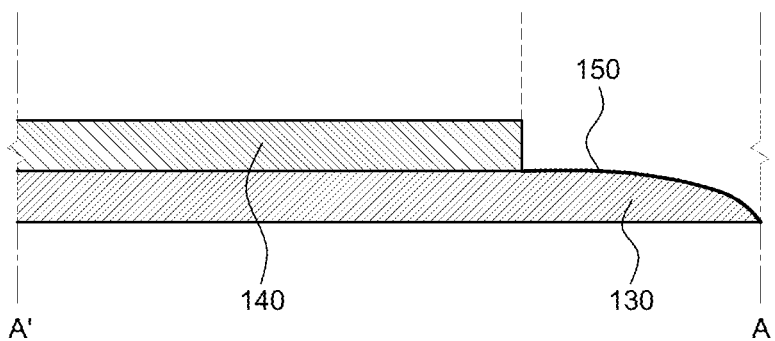
FIG. 2C is a cross-sectional view taken by vertically cutting the plane view of the area X of FIG. 1 along line A to A.

FIGS. 2A to 2C illustrate the connector portion 150 formed by exposing a part of the upper surface of the conductive path 120.

FIG. 2A is a plane view of the area X. Referring to FIG. 2A, the extension portion 130 is further protruded toward the outside than the protective layer 140. Or, the protective layer 140 exposes a part of an upper edge of the extension portion 130. In other words, the protective layer 140 is configured such that a partial end of a corner of the conductive path 120 is exposed.

Herein, the connector portion 150 is the area where the part of the upper edge of the extension portion 130 is exposed for electrical connection purposes. In other words, the connector portion 150 is the area where the partial end of the corner of the conductive path 120 is exposed. Meanwhile, at a portion where the protective layer 140 and the extension portion 130 are overlapped, a width of the protective layer 140 is greater than a width of the extension portion 130, so that the protective layer 140 is formed to cover the extension portion 130. As for the conductive path 120 which does not include the extension portion 130, the extension portion 130 may be substituted with the conductive path 120 in all descriptions.

FIG. 2B is a side view of the area X. Referring to FIG. 2B, at a portion where the protective layer 140 and the extension portion 130 are overlapped, the protective layer 140 is formed to cover and shield the extension portion 130. At a portion where the protective layer 140 and the extension portion 130 are not overlapped, the extension portion 130 is formed to be protruded from the protective layer 140 toward the outside, and thus, the extension portion 130 is exposed. Herein, the connector portion 150 is an upper surface of the exposed extension portion 130.

FIG. 2C is a cross-sectional view taken by vertically cutting the plane view of the area X along line A to A'. Referring to FIG. 2C, a portion where the protective layer 140 and the extension portion 130 are not overlapped is at a more outer position than a portion where the protective layer 140 and the extension portion 130 are overlapped. In other words, a portion where the protective layer 140 is not positioned on an upper surface of the extension portion 130 is at a more outer position than a portion where the protective layer 140 is positioned on the upper surface of the extension portion 130. Thus, the protective layer 140 is configured such that the partial end of the corner of the conductive path 120 is exposed. Herein, the connector portion 150 is the upper surface of the extension portion 130 which is exposed since the protective layer 140 is not positioned thereon.

In all description with reference to FIGS. 2A to 2C, as for the conductive path 120 which does not include the extension portion 130, the extension portion 130 may be substituted with the conductive path 120.

In the display panel 100 of according to an embodiment of the present invention, there may be provided a display panel in which the protective layer 140 covering the overall conductive path 120 is included and the protective layer 140 exposes a partial area of the conductive path 120 so as to form the connector portion 150.

Figure 3A:
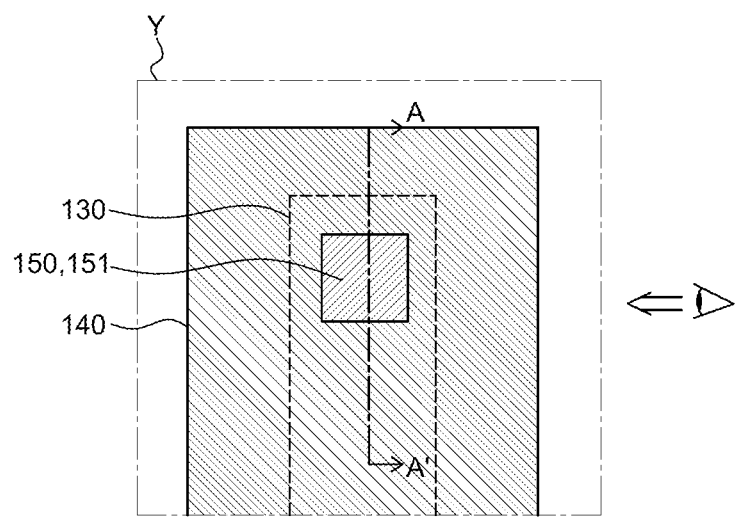
FIG. 3A is a plane view of an area Y of FIG. 1.
Figure 3B:
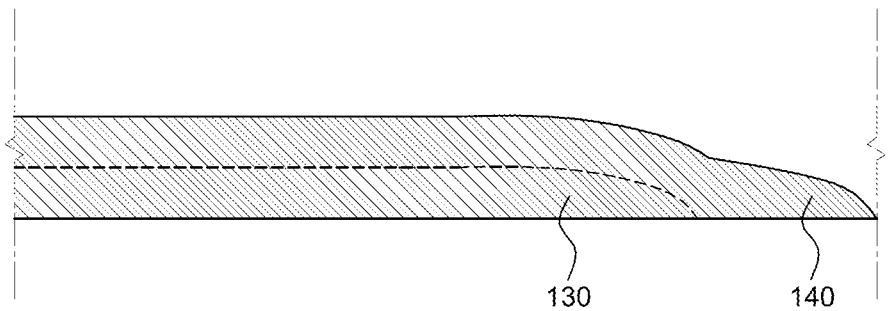
FIG. 3B is a side view of the area Y of FIG. 1.
Figure 3C:
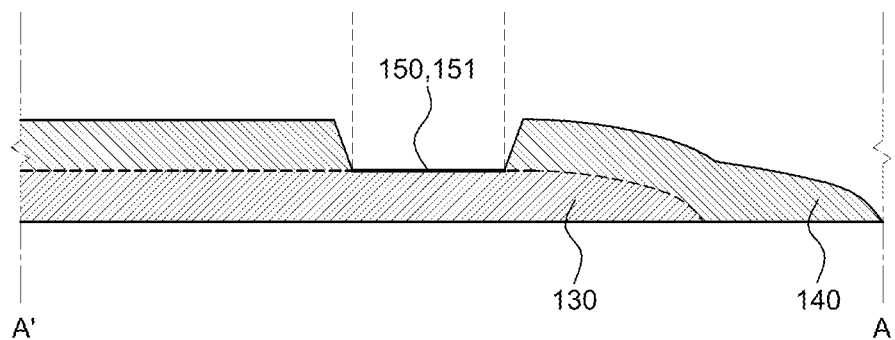
FIG. 3C is a cross-sectional view taken by vertically cutting the plane view of the area Y of FIG. 1 along line A to A.

FIGS. 3A to 3C illustrate the hole 151 and the connector portion 150 formed by shielding the entire edge of the conductive path 120.

FIG. 3A is a plane view of an area Y. Referring to FIG. 3A, the protective layer 140 is further protruded toward the outside than the extension portion 130. Or, the protective layer 140 may be arranged such that the hole 151 is formed by exposing a part of the upper surface of the extension portion 130 and may also be configured to cover the entire end of the corner of the extension portion 130. That is, the protective layer 140 may be positioned so as to entirely cover at least the edge of the upper surface of the extension portion 130. Meanwhile, a width or size of the area of the protective layer 140 is greater than a width or size of the area of the extension portion 130, so that the protective layer 140 may be formed to cover the extension portion 130. The upper surface of the extension portion 130 may be exposed by at least one hole 151 of the protective layer 140. The connector portion 150 is a surface of the conductive path 120 exposed through the hole 151 as such. That is, the connector portion 150 is the bottom of the hole 151.

FIG. 3B is a side view of the area Y. Referring to FIG. 3B, the protective layer 140 covers the entire edge of the extension portion 130. Thus, the extension portion 130 looks as if it does not include an exposed area.

FIG. 3C is a cross-sectional view taken by vertically cutting the plane view of the area Y along line A to A'. Referring to FIG. 3C again, the extension portion 130 looks as if its entire area is not exposed. However, as illustrated in FIG. 3C, the connector portion 150 for the exposed area of the surface of the extension portion 130 is actually formed. That is, referring to FIG. 3C, the protective layer 140 is formed to expose a part of the conductive path 120 through the hole 151.

To be more specific, referring to FIG. 3C, the entire edge of the extension portion 130, e.g., the entire end of the corner of the extension portion 130, is covered by the protective layer 140. Meanwhile, since the protective layer 140 exposes a part of the extension portion 130 through the hole 151, there is a portion where the protective layer 140 is not overlapped with the extension portion 130.

In all description with reference to FIGS. 3A to 3C, as for the conductive path 120 which does not include the extension portion 130, the extension portion 130 may be substituted with the conductive path 120.

According to the display panel according to an embodiment of the present invention, the protective layer 140 may be formed to cover the entire end of the corner of the conductive path 120 and also exposes a partial area of the conductive path 120. That is, since the protective layer 140 having a pattern including the hole 151 is formed, the connector portion 150 may be formed such that the edge of the conductive path 120 is not exposed to the outside.

Thus, among back-end processes, during a cleaning process using a liquid such as distilled water, it is possible to reduce or minimize a loss of the edge of the conductive path 120. Further, a shape of the conductive path 120 can be maintained, and thus, the conductive path 120 can have an overall constant resistance. Furthermore, through the hole 151 and the connector portion 150 maintained in a desired shape, the conductive path 120 can be more easily applied with an electrical signal.

Although not illustrated, in some cases, the hole 151 and the connector portion 150 may be positioned in other areas rather than in the protruded extension portion 130 of the conductive path 120 in the display panel according to the exemplary embodiment of the present invention. In this case, similar to the conductive path which does not include the extension portion, the extension portion 130 may be substituted with the conductive path 120 in all descriptions.

Meanwhile, while the conductive path 120 is manufactured by a method of evaporating or boiling the polar organic material from the conductive ink, a so-called pull-back region may be formed around the conductive path 120. Hereinafter, the pull-back region will be described with reference to FIG. 5.

Figure 5:
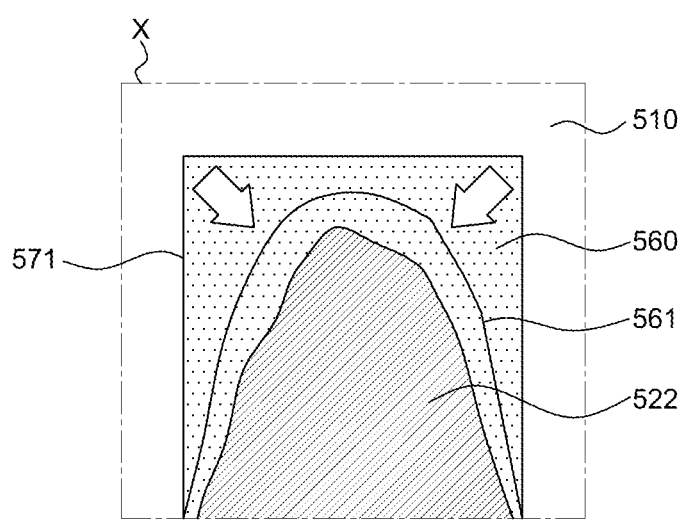
FIG. 5 is a plane view enlarging a portion of a conventional conductive path corresponding to the area X of FIG. 1.

FIG. 5 is a plane view enlarging a portion of a conventional conductive path corresponding to the area X of FIG. 1. For reference, a pull-back region 560 is illustrated around a certain area of the conventional conductive path corresponding to the area X of FIG. 1. However, the pull-back region 560 may appear in any area around the conductive path.

The arrows in FIG. 5 indicate a contraction direction of the conductive ink as a volume of the polar organic material included in the conductive ink gradually decreases. This direction is the same as a direction in which the conductive particles move while being coagulated. The contraction direction of the conductive ink can be recognized by a trace or mark of the conductive ink during a contraction process. The trace of the conductive ink can be observed with the naked eye or through a microscope, and it is referred to as the pull-back region 560. Herein, the pull-back region 560 refers to a trace region in which the polar organic material included in the conductive ink is removed by evaporation or boiling, and thus, the conductive ink is decreased and contracted in volume. That is, the pull-back region 560 is a trace region remaining after the polar organic material is removed from the conductive ink in the same manner as being stained. Herein, if the solvent of the conductive ink is removed through several discontinuous processes during a specific time interval under the same or different conditions rather than through a single continuous process, a border 561 of a stain may be formed in the pull-back region 560 so as to correspond to the number of processes.

Herein, a size of the pull-back region 560 may be the same as a size between a border 571 for jetting the conductive ink and a conductive path 522 as can be recognized with the naked eye or through a microscope. Or, a size of the pull-back region 560 may be the same as a size between the border 561 of the stain and the conductive path 522 as can be recognized with the naked eye or through a microscope.

As a result, a size of the pull-back region 560 is proportional to a degree of difference between (1) a shape when the conductive ink is jetted and (2) a shape of a conductive path 522 formed by removing the polar organic material from the jetted conductive ink and hardening (e.g., sintering) the conductive ink. That is, a size of the pull-back region 560 refers to an error between (1) an intended design of the conductive path when the conductive ink is jetted and (2) a resulting design of the conductive path 522.

Typically, if a conductive path is used as a path for an electrical signal, a thickness and a width of the conductive path need to be uniform in the entire area. However, if the conductive path is formed into a non-smooth and non-uniform shape, a resistance value of the conductive path is also changed in part. Further, disconnection in the conductive path may occur at any position. The pull-back region 560 reflects such non-uniformity in shape or performance of the conductive path. As a result, from a shape or a size of the pull-back region 560, a shape and performance of the conductive path 522 can be indirectly determined. To be more specific, it can be determined that as a size of the pull-back region 560 increases, uniformity in shape (e.g., width or thickness) of the conductive path 522 decreases. Further, it can be determined that as a size of the pull-back region 560 increases, performance of the conductive path 522 decreases.

Further, a size of the pull-back region 560 is regarded as a size included in a dummy area or a margin in terms of operation of a process. In order to minimize the disconnection in the conductive path or the size of dummy area, it is beneficial to minimize a size of the pull-back area 560.

Also, as the holes 151 or the connector portions 150 in the extension portions 130 are arranged to be closer to an edge of the display panel 100, a distance between the edges of the extension portions 130 and the display panel 100 becomes smaller. Such a distance does not exist, especially when the edge of the connector portions 150 in the extension portions 130 is designed to meet the edge of the display panel 100. As discussed above, the conductive ink of the extension portions 130 contracts in a direction opposite to the edge of the display panel 100 during the removal process of the solvent. This may make it difficult to design the distance between the edges of the extension portions 130 and the display panel 100 to be smaller as the size of the pull-back region 560 increases. In other words, the size of the pull-back region 560 should be beneficially as small as possible in order to arrange the connector portions 150 at the edge of the display panel 100.

Figure 6:
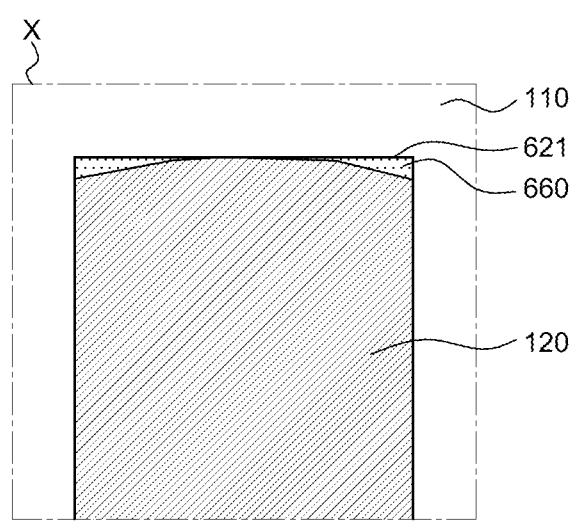
FIG. 6 is a schematic diagram illustrating a plane view of a conductive path 120 according to an exemplary embodiment of the present invention.

The inventors of the present invention found that the size of the pull-back region 560 can be affected at least by (1) a contraction speed of the conductive ink caused by a surface tension of the conductive ink, (2) an evaporation or boiling speed of the organic solvent, and (3) a volume of micropores remaining in the conductive ink while the conductive path is formed using the conductive ink. By controlling the aforementioned factors, the size of the pull-back region 560 of the conductive path 120 can be reduced, as illustrated in FIG. 6. Hereinafter, the conductive path 120 according to the exemplary embodiment of the present invention will be described with reference to FIG. 6.

FIG. 6 is a schematic diagram illustrating a plane view of the conductive path 120 according to the exemplary embodiment of the present invention.

The inventors of the present invention found that removing the polar organic solvent material at a high speed helps the conductive ink be contracted to have a reduced or minimum surface area. Thus, the inventors of the present invention conducted experiments to induce the conductive particles dispersed in the polar organic solvent material to rapidly settle down on the substrate 110. Details thereof will be described later.

A volume of the conductive ink gradually decreases while the polar organic material is removed by evaporation or boiling. In the meantime, the conductive ink is contracted to have a minimum size by a surface tension of the conductive ink. The conductive particles are coagulated along with contraction of the conductive ink. Such a movement of the conductive particles is left as a trace, e.g., a pull-back region. The inventors of the present invention found that the polar organic solvent material can be rapidly removed by a high-degree vacuum removal process.

The high-degree vacuum removal process refers to a process for removing liquid by active vaporization, a phase transition from liquid to gas using boiling. The inventors of the present invention lowered the boiling point of the organic solvent of the conductive ink by reducing a pressure in an environment where the organic solvent is evaporated and boiled. To be more specific, the pressure was reduced such that the boiling point of the polar organic material is lower than a temperature, e.g. about 130° C., at which organic light emitting diodes or liquid crystals in the display panel may be damaged. That is, the environment was set such that the solvent of the conductive ink can undergo a phase transition from liquid to gas without substantially changing the performance of the display panel. Further, when an organic material having the boiling point of 130° C. at a certain pressure between the atmospheric pressure and a pressure at the triple point was used as a solvent of the conductive ink, the environment was set such that the organic material can be vaporized (e.g., boiled) at a pressure lower than the atmospheric pressure. Furthermore, the environment was set such that boiling can be more actively carried out by removing the organic material vaporized into gas from the environment by suction. Since the high-degree vacuum removal process was performed under this environment, the polar organic material can be rapidly removed, and the conductive particles can be coagulated at a position where the conductive ink is initially jetted substantially without allowing time for the conductive particles to move.

In this way, the conductive path 120 can be manufactured as originally designed with a reduced size of a pull-back region.

Further, the inventors of the present invention induced the conductive particles to be more rapidly settled by removing micro-pores present in the conductive ink and induced the conductive particles to be more rapidly coagulated by reducing a distance between the conductive particles. Details thereof will be described with reference to FIGS. 7A and 7B.

Figure 7A:
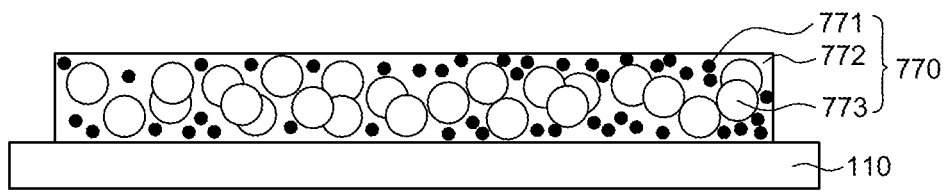
FIG. 7A is a schematic diagram illustrating the inside of conductive ink when the conductive ink is present at the atmospheric pressure.
Figure 7B:
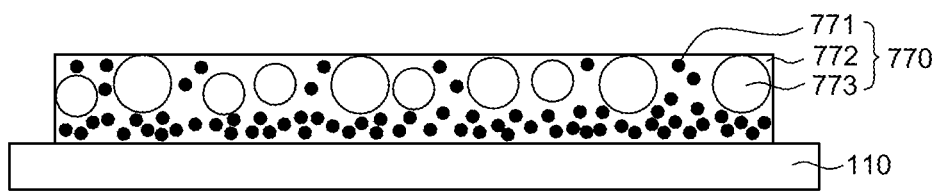
FIG. 7B is a schematic diagram illustrating the inside of conductive ink when a solvent of the conductive ink is removed at a lower pressure than the atmospheric pressure.

FIG. 7A is a schematic diagram illustrating the inside of conductive ink at the atmospheric pressure. FIG. 7B is a schematic diagram illustrating the inside of conductive ink under the same conditions, except that a pressure is lower than the atmospheric pressure.

A conductive ink 770 includes micro-sized pores 773 when being manufactured while conductive particles 771 are dispersed in an organic material 772 as a solvent of the conductive ink 770. Further, when the conductive ink 770 passing through the nozzle of the inkjet printer is jetted onto a substrate 110, the pores 773 are formed. The pores 773 may be included in the jetted conductive ink 770 on the substrate 110. The pores 773 form gaps between the conductive particles 771, and thus prevent the conductive particles 771 from being coagulated with each other. Further, when the conductive path 120 is sintered after the solvent-removal process, remaining gas in the pores 773 may expand and explode. In case where oxygen is included in the pores 773, the conductive path 120 may be burnt out. Thus, when the organic material 772 is removed from the conductive ink 770, the pores 773 should also be beneficially removed.

Depending on a difference between the pressures in FIGS. 7A and 7B, a volume of the pores 773 in FIG. 7B becomes greater than a volume of the pore 773 in FIG. 7A. The inventors of the present invention induced the pores 773 in the conductive ink 770 to be increased in volume and the increased pores 773 to be exposed through a surface of the conductive ink 770 by performing a removal process in an environment of a high-degree vacuum, a pressure of which is lower than the atmospheric pressure, as illustrated in FIG. 7B. Since the high-degree vacuum removal process was performed as such, as many micro pores 773 as possible were removed from the conductive ink 770.

As can be seen from comparison between FIGS. 7A and 7B, the inventors of the present invention reduced gaps between the conductive particles 774 in the conductive ink 770 by increasing a volume of the pores 773 so as to induce the conductive particles 774 to be rapidly coagulated with each other. Further, the inventors of the present invention induced the conductive particles 774 to be rapidly coagulated with each other by inducing the conductive particles 774 to be moved toward the substrate 110 and settled in a state where the conductive particles 774 were floating in the organic material 772.

As such, the inventors of the present invention performed the high-degree vacuum removal process on the conductive ink 770 and induced the conductive particles 774 to be more rapidly, densely coagulated so as to manufacture the conductive path 120 where moving traces (i.e. pull-back) of the conductive particles 774 are substantially not present.

In other words, as illustrated in FIG. 6, a size of the pull-back region remaining after the conductive path 120 is formed from the conductive ink was minimized to be substantially close to 0. That is, the conductive path 120 was formed to have substantially the same shape as that of an initial design, and a size difference between a border 621 for jetting the conductive ink and the conductive path 120 was substantially not recognized by the naked eye or through a microscope. That is, a pull-back region 660 was practically invisible. Herein, the pull-back region 660 illustrated in FIG. 6 is to describe that the pull-back region 660 is substantially not present or the pull-back region 660 is present, but the size is so small that it is substantially not recognized. That is, although illustrated in FIG. 6, the pull-back region 660 may not be present at all. In other words, the conductive path 120 according to the exemplary embodiment of the present invention may not include the pull-back region 660, since the conductive path 120 is overlapped with the border 621 for jetting the conductive ink.

Further, as compared with the conventional conductive path to which the high-degree vacuum removal process is not performed, the conductive path 120 having a flatter surface was manufactured. Furthermore, as compared with the conventional conductive path to which the high-degree vacuum removal process is not performed, the conductive path 120 including a smaller amount of micro-pores was manufactured.

As compared with the conventional conductive path, the conductive path 120 according to the exemplary embodiment of the present invention has a remarkably small size of a nearby pull-back region and a higher uniformity in shape.

To be more specific, a volume of pores per unit volume in the conductive path 120 to which the high-degree vacuum removal process is performed according to the exemplary embodiment of the present invention is smaller than a volume of pores per unit volume in a conventional conductive path manufactured under the same conditions as the conductive path 120 according to the exemplary embodiment of the present invention, except that the removal process is performed at the atmospheric pressure. Further, a surface of the conductive path 120 to which the high-degree vacuum removal process is performed according to the exemplary embodiment of the present invention is flatter than a surface of the conventional conductive path manufactured under the same conditions as the conductive path 120 according to the exemplary embodiment of the present invention except that the removal process is performed at the atmospheric pressure. Furthermore, a density of the conductive path 120 to which the high-degree vacuum removal process is performed according to the exemplary embodiment of the present invention is higher than a density of the conductive path manufactured under the same conditions as the conductive path 120 according to the exemplary embodiment of the present invention except that the removal process is performed at the atmospheric pressure. A sheet resistance value of the conductive path 120 to which the high-degree vacuum removal process is performed according to the exemplary embodiment of the present invention, which has a higher uniformity in shape and a higher density than those of the conventional conductive path, is lower than a sheet resistance value of the conventional conductive path manufactured under the same conditions as the conductive path 120 according to the exemplary embodiment of the present invention except that the removal process is performed at the atmospheric pressure.

Accordingly, the conductive path 120 according to the exemplary embodiment of the present invention can more readily transport an electrical signal than the conventional conductive path to which the removal process is performed at the atmospheric pressure.

Hereinafter, a display panel with a built-in conductive path according to the exemplary embodiment of FIG. 1 will be described.

Figure 4:
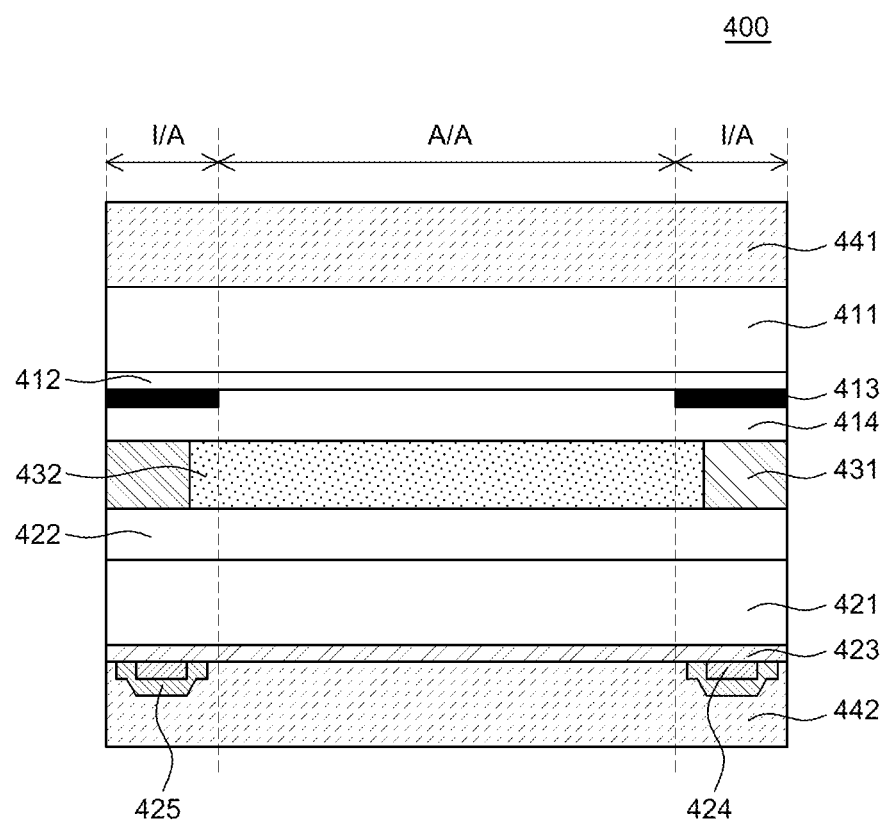
FIG. 4 is a cross-sectional view taken by cutting a cross section of a display device according to an exemplary embodiment of the present invention.

FIG. 4 is a cross-sectional view taken by cutting a cross section of a display device according to an exemplary embodiment of the present invention.

A display device 400 according to the exemplary embodiment of the present invention of FIG. 4 is exemplified as a liquid crystal display (LCD). However, it is provided only for the purpose of illustration and is not intended to be limiting of the scope of present invention. For example, the display device according to the exemplary embodiment of the present invention may be an organic light emitting display (OLED). This is because the conductive paths with reduced pull-back region according to the exemplary embodiments described herein are clearly applicable to various types of display devices as a part of conductive wires.

The display device 400 of FIG. 4 is illustrated as a display device including a metal pattern 424. The metal pattern 424 may perform the conductive path 120 in the display device 400, and all the descriptions regarding the conductive path 120 will be applied to the metal pattern 424. However, it is provided only for the purpose of illustration and is not intended to be limiting of the scope of present invention. For example, the display device 400 according to the exemplary embodiment of the present invention may include the metal pattern 424 which may be manufactured by inkjet-printing conductive ink and may have a non-integrated, closed loop shape. Or, the display device 400 according to the exemplary embodiment of the present invention may include the metal pattern 424 which may be manufactured by inkjet-printing conductive ink and may have an opened loop shape.

Referring to FIG. 4, the display device 400 according to the exemplary embodiment of the present invention will be described.

The metal pattern 424 may be arranged in the display device 400 that emits light to achieve displaying of certain images or visual information to be recognized by a user. The metal pattern 424 may have an integrated loop shape and may perform a conductive path 120 for transceiving electrical signal. All the descriptions on the conductive path 120 of FIG. 1 can be applied to the metal pattern 424, and thus, redundant explanation may be omitted and any components which are not described above will be described.

In addition to the conductive path 120, the display device 400 according to the exemplary embodiment of the present invention includes the integrated loop-shaped metal pattern 424 arranged in an active area A/A where an image is displayed and an inactive area I/A. The inactive area I/A may be positioned around the active area A/A, for example, so as to surround the active area A/A. Herein, the integrated loop-shaped metal pattern 424 may be positioned in the inactive area I/A and may surround the active area A/A. An arrangement of the metal pattern 424 in the display device 400 will be described in detail with reference to FIG. 4.

The display device 400 according to the exemplary embodiment of the present invention is divided into the active area A/A and the inactive area I/A near the active area A/A. The inactive area I/A is formed to surround the active area A/A. Therefore, the inactive areas I/A are respectively positioned around both edges of the display device 400 in a cross-sectional view.

The display device 400 according to the exemplary embodiment of the present invention includes: a display panel, a metal pattern 424 on a surface of one side of the display panel as a conductive path, and two polarization layers (e.g., a lower polarization layer 442 and an upper polarization layer 441) that sandwich the display panel.

To be more specific, the display device 400 includes a lower substrate 421 on which a TFT layer 422 is provided, an upper substrate 411 on which a color filter layer 412 is provided, and a liquid crystal layer 432 between the lower substrate 421 and the upper substrate 411. The liquid crystal layer 432 is comprised of liquid crystals that control an amount of light passing through a gap formed by a plurality of spacers between the two substrates 411 and 421. The display device 400 also includes a sealing portion 431 that surrounds the liquid crystal layer 423 in the inactive area I/A for sealing liquid crystals. The color filter layer 412 is comprised of a plurality of color filters, each corresponding to one of the pixels in the active area A/A. The color filter layer 412 also includes a black matrix 413 on its lower surface to define the inactive area I/A of the display panel. A planarization layer 414 is formed on the lower surface of the color filter layer 412 to fill in step differences of the color filter layer 412, which allows a uniform gap to be formed between the color filter layer 412 and the lower substrate 421.

A conductive layer 423 may be formed on a lower surface of the display panel. A metal pattern 424 may be formed on a lower surface of the display panel. So, a conductive layer 423 may be positioned between a lower substrate 421 and a metal pattern 424. A metal pattern 424 contacts directly with a conductive layer 423. A protective layer 425 is positioned in an inactive area I/A and covers a metal pattern 424.

Herein, the metal pattern 424 may be formed of the same material as that of the conductive path 120, the protective layer 425 may be formed of the same material as that of the protective layer 140, and the lower substrate 421 may be formed of the same material as that of the substrate 110, and the liquid crystal layer 432 includes liquid crystals as light controlling material. That is, all the descriptions regarding the conductive path 120 will be applied to the metal pattern 424, and all the descriptions regarding the protective layer 140 will be applied to the protective layer 425, and all the descriptions regarding the substrate 110 will be applied to the lower substrate 421. Therefore, in describing these components, the same descriptions as described above may be omitted.

The components included in the display device 400 are arranged on the upper substrate 411, which is configured to support a shape of the display device 400. That is, the upper substrate 411 serves as a basic frame of the display device

400. The upper substrate 411 may be fixed in a flat state or fixed as being bent, or may be bent and unbent in a flexible manner. Further, the upper substrate 411 may be formed of a glass or a plastic-based polymer material. The upper substrate 411 may be transparent or translucent.

In order to shield an edge area where an image is not displayed on the upper substrate 411 of the display device 400, the black matrix 413 is formed. An area where the black matrix 413 is formed is an inactive area I/A. An area where an image is illustrated to a user, an active area A/A, is defined by the black matrix 413. The black matrix 413 is configured to shield various lines, signal lines, and tapes, and may include a black resin that absorbs light.

A touch sensor may be positioned inside or outside the display panel. The touch sensor may be formed as a touch screen panel or array including a separate substrate and may be combined with the display panel. Or, the touch sensor may be formed into a film and may be combined with the display panel. Or, the touch sensor may be formed into a touch electrode as a component of the display panel and may be positioned on/in the color filter layer 412 and/or on/in the TFT layer 422.

The TFT layer 422 may include multiple gate lines separated from each other in a predetermined gap and arranged in one direction, multiple data lines separated from each other in a predetermined gap and arranged in a direction perpendicular to the respective gate lines, multiple pixel electrodes formed into a matrix shape in respective pixel areas defined by the crossings between the respective gate lines and the respective data lines, and multiple pixel driving circuits including thin film transistors (TFT) which are switched by signals from the gate lines and transfer signals from the data lines to the pixel electrodes, respectively. A liquid crystal in the liquid crystal layer 432 is driven by the pixel driving circuits in the TFT layer 422.

The conductive layer 423 may be introduced to reduce or minimize errors caused by driving signals applied to the TFT layer 422 for driving the liquid crystal when detecting user's touches. In this case, the conductive layer 423 can act as a signal interference shield layer. An electrical signal is applied to a touch electrode of the touch sensor to detect a touch position at the same time when an electrical signal is applied to a pixel electrode and a common electrode of the TFT layer 422 to drive the liquid crystal. In this case, the touch electrode of the touch sensor and the pixel electrode or common electrode of the TFT layer 422 become a first electrode and a second electrode, respectively, and various structures as dielectric members are provided between the first and second electrodes, so that a parasitic capacitance is formed. In the parasitic capacitance, the electrical signal applied to the pixel electrode or common electrode of the TFT layer 422 causes interference in the electrical signal applied to the touch electrode of the touch sensor. That is, the electrical signal applied to the pixel electrode or common electrode of the TFT layer 422 acts as a noise on the electrical signal applied to the touch electrode of the touch sensor.

The conductive layer 423 may be introduced to reduce or minimize interferences between two different touch signals provided by two different types of touch sensors. For example, two different types of touch sensors can be a capacitance type touch sensor (e.g., projected capacitive touch sensor) including but not limited to in-cell and on-cell types of touch sensors and a resistive type touch sensor (e.g., pressed touch sensor) that are implemented to detect or determine a user's touch, with the TFT layer 422 therebetween. Touch electrodes of the capacitance type touch sensor may be provided on top of the TFT layer 422, while touch electrodes of the resistive type touch sensor may be provided below the TFT layer 422. Also, the touch electrodes of the resistive type touch sensor may be arranged below the metal pattern 424. As a result, the conductive layer 423 and the metal pattern 424 can be provided between touch electrodes of two different types of touch sensors. In other words, the conductive layer 423 and the metal pattern 424 can be, for example, provided between one touch electrode of the capacitance touch sensor and one touch electrode of the resistive touch sensor. Also, the liquid crystal layer 432 can be provided between one touch electrode of the capacitance touch sensor and the conductive layer 423.

At least one touch electrode of the capacitance touch sensor may be formed in between a lower substrate 412 and the upper substrate 411, and the capacitance touch sensor may be an in-cell touch sensor. The conductive layer 423 may be formed on a lower surface of the lower substrate 421 on an upper surface thereof the TFT layer 422 is formed. That is, if a surface of the lower substrate 421 on which the TFT layer 422 is formed is referred to as one side surface, the conductive layer 423 is formed on the other side surface of the lower substrate 421. Herein, the conductive layer 423 may be transparent in order for the light emitted from a backlight unit to be combined with the display panel to be incident into the display device 400.

Meanwhile, at least one touch electrode of the capacitance touch sensor may be formed on an upper surface of the upper substrate 411, and the capacitance touch sensor may be an on-cell touch sensor. The conductive layer 423 may be formed on an upper surface of the upper substrate 411 on a lower surface thereof the color filter layer 412 is formed. That is, if a surface of the upper substrate 411 on which the color filter layer 412 is formed is referred to as one side surface, the conductive layer 423 is formed on the other side surface of the upper substrate 411. Herein, the conductive layer 423 needs to be transparent since the conductive layer 423 may be positioned in a direction of light being polarized from the liquid crystal layer 432 and emitted from the display device 400.

Touch electrodes of a pressed touch sensor may be provided below the lower substrate 421 as one of the two different types of touch sensors. In this case, the conductive layer 423 and the metal pattern 424, which serve to reduce or minimize interferences of two different types of touch sensors, can be provided between the touch electrodes of the capacitance touch sensor located on top of the lower substrate 421 and the touch electrodes of the pressed touch sensor located below the lower substrate 421. A sheet resistance of the metal pattern 424 is beneficially lower than that of the conductive layer 423. Due to its high conductivity, the metal pattern 424 can alleviate non-uniformity in the overall sheet resistance of the conductive layer 423 that may occur due to the low sheet resistance of the conductive layer 423.

As a result, the conductive layer 423 may be formed of a transparent and conductive material. For example, the conductive layer 423 may be formed of any one selected from indium oxide, tin oxide, zinc oxide, indium-tin oxide, indium-zinc oxide, tin-antimony oxide, graphene, carbon nano tube, Ag nano particle, Ag nano wire, and a thin metal mesh. The conductive layer 423 is beneficially thin to transmit light.

If the conductive layer 423 is included in the display device 400 according to the exemplary embodiment of the present invention, the metal pattern 424 may be positioned in direct contact with one surface of the conductive layer 423. Herein, a sheet resistance value of the metal pattern 424 is beneficially smaller than a sheet resistance value of the conductive layer 423. This is because the metal pattern 424 is desired to further improve a signal interference shield effect of the conductive layer 423. To be more specific, in order to uniformly reduce a touch noise in the entire surface of the display device 400 according to the exemplary embodiment of the present invention, the metal pattern 424 having a lower sheet resistance value than that of the conductive layer 423 is beneficially provided. Further, the metal pattern 424 may be positioned so as to correspond to the inactive area I/A defined by the black matrix 413. Thus, the metal pattern 424 may be positioned in the inactive areas FA while being in direct contact with the one side surface of the conductive layer 423 and it may be formed into a ring shape surrounding the active area A/A.

In order to remove static electricity induced on the upper substrate 411 or the lower substrate 421 by the parasitic capacitance causing a touch signal interference, the conductive layer 423 is formed so as to be in direct contact with the rear surface of the upper substrate 411 or the rear surface of the lower substrate 421 and the conductive layer 423 is grounded. In this case, both the conductive layer 423 and the metal pattern 424 are grounded. Herein, the conductive layer 423 serves to shield the entire surface of the upper substrate 411 and the lower substrate 421, and thus, the conductive layer 423 is positioned in the active area A/A. As a result, the entire surface of the conductive layer 423 is desired to be transparent, which becomes a limitation in selecting a highly conductive material constituting the conductive layer 423.

In order to more readily shield a noise in the entire surface of the conductive layer 423, the metal pattern 424 is formed so as to be in direct contact with one side surface of the conductive layer 423 and have a lower sheet resistance value than that of the conductive layer 423, and the metal pattern 424 is grounded through at least one connector portion of the metal pattern 424. Because static electricity induced on the upper substrate 411 or the lower substrate 421 is discharged through the conductive layer 423 and the metal pattern 424, it is possible to reduce touch signal interference and thus, reduce or prevent malfunction of a touch.

As such, if the conductive layer 423 is in contact with the metal pattern 424 in the display device 400 according to the exemplary embodiment of the present invention, the conductive layer 423 and the metal pattern 424 are electrically connected to each other, and thus, they have substantially the same potential at all times. Further, if the conductive layer 423 is in contact with the metal pattern 424 in a state where the display device 400 according to the exemplary embodiment of the present invention is on, they have an unchanged and fixed potential at all times.

The protective layer 425 is formed so as to be in contact with the metal pattern 424. Since a width of the protective layer 425 is greater than a width of the metal pattern 424, the protective layer 425 may cover the metal pattern 424. However, in some cases, the metal pattern 424 is desired to be connected to another lines in order to be applied with a voltage or grounded. In order to do so, the protective layer 425 may expose a part of the metal pattern 424. The protective layer 425 is formed of a material easily bonded to the metal pattern 424 and the conductive layer 423.

FIG. 4 illustrates that the protective layer 425 is patterned along a shape of the metal pattern 424. However, if the protective layer 425 is transparent and has the same refractive index as that of the conductive layer 423, the protective layer 425 may be continuously positioned in the active area and the inactive area without being patterned. Using the protective layer 425, a loss of the metal pattern 424 can be reduced or minimized.

Hereinafter, a method for manufacturing a display device will be described according to an exemplary embodiment of the present invention. If the components described above in explaining the display device according to the exemplary embodiment of the present invention are the same as components to be described in explaining the method for manufacturing a display device according to the exemplary embodiment of the present invention, the same explanation is applied, and thus, redundant descriptions of the respective components will be omitted.

The method for manufacturing a display device according to the exemplary embodiment of the present invention includes: providing an inactive area of a substrate with ink in which conductive particles are dispersed in a polar organic solvent so as to surround an active area; removing the polar organic solvent from the ink in a high-degree vacuum condition; forming a conductive path by hardening the ink in a high temperature condition; providing an insulating material to cover a surface of the conductive path; and exposing a part of the surface of the conductive path. These steps may be carried out in sequence or some of the steps may be carried out simultaneously.

Herein, the providing an insulating material may include providing an insulating organic material and forming a protective layer by hardening the insulating organic material in a high temperature condition.

Herein, in order to remove the polar organic solvent, the polar organic solvent is removed by vaporization, a phase transition from liquid to gas. In other words, the removing the polar organic solvent may include vaporizing the polar organic solvent. To do so, the removing the polar organic solvent may include performing a high-degree vacuum removal process to the ink.

Herein, when performing a high-degree vacuum removal process, as a pressure for drying decreases, the boiling point of the solvent also decreases, and the ink is dried by vaporization of the polar organic solvent in the ink at a low temperature. By removing the polar organic solvent in the ink at a low temperature, it may be possible to prevent a display device that is vulnerable to a high temperature condition from being defective. The display device vulnerable to a high temperature condition is known to become typically defective at a temperature of 130° C. or higher. Therefore, the high-degree vacuum removal process for reducing the boiling point of the polar organic solvent is desired to be performed at a pressure at which the polar organic solvent can be vaporized at a temperature lower than 130° C. In other words, the high-degree vacuum condition refers to a condition set to a pressure at which the boiling point of the polar organic solvent is lower than 130° C. For example, the high-degree vacuum condition refers to a condition set to a predetermined pressure and a predetermined temperature, and the predetermined pressure is lower than the atmospheric pressure and the predetermined temperature is equal to or higher than the boiling point of the polar organic solvent at the predetermined pressure, which is lower than 130° C. In addition, the high-degree vacuum condition refers to a condition in which a gas-state polar organic material vaporized from the polar organic solvent can be continuously discharged to the outside of the high-degree vacuum condition by suction.

Ink is a paste-state composition in which conductive particles are dissolved in a solvent and has flow ability. As a result, in an ink manufacturing process for dispersing conductive particles, pores may be included in ink. Or, in a process for providing ink to a substrate, pores may be included in the ink that is provided. These pores present in the ink are desired to be removed. Through the high-degree vacuum removal process, the pores can be removed from the ink. In other words, the removing the polar organic solvent in a high-degree vacuum condition may remove the pores together with the polar organic solvent.

Further, the removing the polar organic solvent and the forming a conductive path may be carried out in sequence, or may be carried out simultaneously to further reduce a processing time.

The method for manufacturing a display device according to the exemplary embodiment of the present invention may further include forming a connector portion by exposing a part of the conductive path. Herein, the connector portion may be formed by removing a part of a protective layer arranged on an upper surface of the conductive path. Further, the protective layer and the connector portion may be formed at the same time by arranging the protective layer on the upper surface of the conductive path except the connector portion. The connector portion may be formed into a shape in which the conductive path is simply protruded from the protective layer, or may be formed by forming a hole in the protective layer and exposing a part of the surface of the conductive path through the bottom of the hole. Herein, the forming a connector portion by exposing a part of the upper surface of the conductive path by the protective layer may include a forming a hole in the protective layer.

The method for manufacturing a display device according to the exemplary embodiment of the present invention may further include cleaning the substrate and forming a polarization plate so as to be in contact with the protective layer after the exposing a part of the conductive path.

The method for manufacturing a display device according to the exemplary embodiment of the present invention may further include forming a conductive layer continuously arranged in the entire area of the active area and the inactive area before the providing an inactive area of a substrate with ink in which conductive particles are dispersed in a polar organic solvent so as to surround an active area. Herein, the conductive layer may be a surface on which the ink is provided. That is, the conductive layer may be in direct contact with a lower surface of the conductive path.

Thus, in the display device according to the exemplary embodiment of the present invention, the conductive path 120 or metal pattern 424 having an integrated loop shape is formed in a continuous and seamless manner. Therefore, there may be provided the display device with the built-in conductive path 120 or metal pattern 424 further minimized in interface resistance or contact resistance.

Further, in the display device according to the exemplary embodiment of the present invention, the conductive path is covered by the protective layer. Therefore, there may be provided the display device with the built-in conductive path 120 or metal pattern 424 minimized in a loss of an edge during the cleaning step.

Furthermore, according to the display device according to the exemplary embodiment of the present invention, there may be provided the conductive path 120 or metal pattern 424 and the display device with the built-in conductive path 120 or metal pattern 424 that are more easily bonded to a surface on which the conductive path 120 or metal pattern 424 is formed.

Also, in the display device according to the exemplary embodiment of the present invention, the conductive path 120 or metal pattern 424 having an integrated loop shape is formed so as to be in direct contact with the conductive layer (shielding layer) 423 for reducing a touch noise in the display device. Therefore, there may be provided the display device with the built-in conductive path 120 or metal pattern 424 which can more effectively discharge induced static electricity and improve a touch function.

Further, according to the display device according to the exemplary embodiment of the present invention, there may be provided the display device with the built-in conductive path 120 or metal pattern 424 in which a pull-back trace region remaining at or around the conductive path is substantially removed from an edge of the conductive path or a protruded region of the conductive path.

Furthermore, according to the display device according to the exemplary embodiment of the present invention, there may be provided the display device with the built-in conductive path 120 or metal pattern 424 from which a pull-back trace region remaining at or around the conductive path is substantially removed, thereby resulting in an overall constant resistance value.

Also, according to the display device according to the exemplary embodiment of the present invention, there may be provided the display device with the built-in conductive path 120 or metal pattern 424 which is formed in a reduced operation time by substantially removing a pull-back trace region while removing the solvent from the conductive ink within a short time.

Further, according to the display device according to the exemplary embodiment of the present invention, there may be provided the display device with the built-in conductive path 120 or metal pattern 424 from which a pull-back trace region is substantially removed, thereby minimizing disconnection of the conductive path at any position.

Furthermore, according to the display device according to the exemplary embodiment of the present invention, there may be provided the display device with the built-in conductive path 120 or metal pattern 424 in which the conductive path is covered by the protective layer, thereby minimizing a loss of an edge of the conductive path or a protruded region of the conductive path during the cleaning step.

The display device according to an embodiment of the present invention includes a conductive path having a structure in which a polar organic material and conductive particles are coagulated and to which a high-degree vacuum removal process is performed; and an insulating protective layer which covers the conductive path and includes a hole exposing a part of the conductive path, in which the conductive path is configured to be applied with an electrical signal through the hole, and a size of a pull-back region present around the conductive path is smaller than a size of a pull-back region present around the conductive path to which a removal process is performed at the atmospheric pressure.

At this time, the high-degree vacuum removal process is a process for vaporizing the polar organic material.

According to another characteristic of the present invention, a volume of pores per unit volume in the conductive path to which the high-degree vacuum removal process is performed is smaller than a volume of pores per unit volume in the conductive path to which the removal process is performed at the atmospheric pressure.

According to another characteristic of the present invention, a surface of the conductive path to which the high-degree vacuum removal process is performed is flatter than a surface of the conductive path to which the removal process is performed at the atmospheric pressure.

According to another characteristic of the present invention, a sheet resistance value of the conductive path to which the high-degree vacuum removal process is performed is lower than a sheet resistance value of the conductive path to which the removal process is performed at the atmospheric pressure.

According to other characteristic of the present invention, the display device further includes an active area; and an inactive area positioned near the active area, in which the conductive path to which the high-degree vacuum removal process is performed is positioned in the inactive area and has an integrated loop shape.

According to another characteristic of the present invention, in the display device, the hole is positioned on a surface of an extension portion of the conductive path to which the high-degree vacuum removal process is performed, and the extension portion is extended toward the outside of the display device.

According to another characteristic of the present invention, the display device further includes a conductive layer positioned between the active area and the inactive area, in which the conductive path to which the high-degree vacuum removal process is performed is in direct contact with a surface of the conductive layer.

According to another characteristic of the present invention, for the display device, the conductive layer is transparent and formed of any one selected from indium oxide, tin oxide, zinc oxide, indium-tin oxide, indium-zinc oxide, tin-antimony oxide, graphene, carbon nano tube, Ag nano particle, Ag nano wire, and thin metal mesh.

According to another characteristic of the present invention, in the display device, a sheet resistance value of the conductive path to which the high-degree vacuum removal process is performed is lower than a sheet resistance value of the conductive layer.

According to another characteristic of the present invention, in the display device, the conductive particles are metallic particles or metal alloy particles.

According to another characteristic of the present invention, in the display device, the conductive particles are formed of silver (Ag).

According to another characteristic of the present invention, in the display device, the boiling point of the polar organic material is 130° C. at a predetermined pressure between the atmospheric pressure and a pressure at the triple point.

The method for manufacturing a display device according to an embodiment of the present invention includes: providing an inactive area of a substrate with ink in which conductive particles are dispersed in a polar organic solvent so as to surround an active area; removing the polar organic solvent from the ink in a high-degree vacuum condition; forming a conductive path by hardening the ink in a high temperature condition; providing an insulating material to cover a surface of the conductive path; and exposing a part of the surface of the conductive path.

According to another characteristic of the present invention, in the method for manufacturing a display device, the removing the polar organic solvent includes vaporizing the polar organic solvent.

According to another characteristic of the present invention, in the method for manufacturing a display device, the removing the polar organic solvent is removing pores together with the polar organic solvent from the solvent.

According to another characteristic of the present invention, in the method for manufacturing a display device, the high-degree vacuum condition refers to a condition set to a pressure at which the boiling point of the polar organic solvent is lower than 130° C.

According to another characteristic of the present invention, in the method for manufacturing a display device, the high-degree vacuum condition refers to a condition set to a predetermined pressure and a predetermined temperature, the predetermined pressure is lower than the atmospheric pressure, and the predetermined temperature is equal to or higher than the boiling point of the polar organic solvent at the predetermined pressure and is lower than 130° C.

According to another characteristic of the present invention, in the method for manufacturing a display device, the exposing a part of the surface of the conductive path is carried out by forming a hole in the protective layer and exposing a part of the surface of the conductive path.

According to another characteristic of the present invention, in the method for manufacturing a display device, the removing the polar organic solvent and the forming a conductive path are carried out at the same time.

Although the exemplary embodiments of the present invention have been described in detail with reference to the accompanying drawings, the present invention is not limited thereto and may be embodied in many different forms without departing from the technical concept of the present invention.

Therefore, the exemplary embodiments of the present invention are provided for illustrative purposes only but not intended to limit the technical concept of the present invention. The scope of the technical concept of the present invention is not limited thereto.

Therefore, it should be understood that the above-described exemplary embodiments are illustrative in all aspects and do not limit the present invention. The protective scope of the present invention should be construed based on the following claims, and all the technical concepts in the equivalent scope thereof should be construed as falling within the scope of the present invention.

It will be apparent to those skilled in the art that various modifications and variation can be made in the present invention without departing from the concepts and scope of the invention. Thus, it is intended that the present invention cover the modifications and variations of this invention provided they come within the scope of the appended claims and their equivalents.

What is claimed is:

1. A method for manufacturing a display device having an active area and an inactive area, the method comprising:
   providing an ink material having conductive particles dispersed in a solvent on a first surface of a substrate in the inactive area, surrounding the active area, wherein the substrate includes a second surface, which is an opposite surface to the first surface, where a TFT layer is formed;
   forming a conductive path by removing the solvent from the ink material in a vacuum condition, wherein the conductive path includes a closed-loop portion and is arranged such that the closed-loop portion of the conductive path surrounds the active area;
   forming a protective layer on the conductive path to have a width greater than the conductive path along a shape of the conductive path and only in the inactive area;
   forming a transparent conductive layer across the active and inactive areas thereon before the providing the ink material; and
   providing the ink material on the transparent conductive layer to form the conductive path.

2. The method according to claim 1, wherein the forming the conductive path comprises hardening the ink material using fluorescent light.

3. The method according to claim 1, wherein the protective layer exposes a part of the surface of the conductive path.

4. The method according to claim 1, wherein the conductive path is completely covered by the protective layer.

5. The method according to claim 4, further comprising forming a contact hole in the protective layer to expose a connector portion of the conductive path.

6. The method according to claim 1, wherein the ink material is provided on the first surface of the substrate by an inkjet printing method.

7. The method according to claim 1, wherein removing the solvent from the ink material involves evacuation of gaseous solvent under the vacuum condition.

8. The method according to claim 1, wherein a sheet resistance of the conductive path is smaller than that of the transparent conductive layer.

9. The method according to claim 1, wherein the solvent is a polar organic solvent.

10. The method according to claim 1, wherein the ink material further includes an organic material having a boiling temperature higher than that of the solvent.

11. The method according to claim 1, wherein removing the solvent from the ink material is proceeded at a temperature lower than 130° C.

12. The method according to claim 1, wherein removing the solvent from the ink material involves a removal process of a plurality of pores included in the ink material that the removal process includes increasing the volume of the pore and exposing the increased pore through a surface of the ink material.

13. A method for forming a metal pattern on a substrate of a display device, the substrate having a first surface and a second surface, which is an opposite surface to the first surface, where a TFT layer is formed, the method comprising:

providing an ink material on the first surface of the substrate, which includes conductive particles and a polar organic solvent, on the substrate by an inkjet printing method, which results in a continuous and seamless shape for the metal pattern, wherein the metal pattern includes a closed-loop shaped metal pattern positioned in an inactive area so as to surround an active area where an image is displayed;

removing the solvent from the ink material in a specific vacuum condition to shorten a time for removing the solvent and to minimize a pull-back trace region, wherein the metal pattern includes a closed-loop shaped metal pattern positioned in an inactive area so as to surround an active area where an image is displayed;

forming a protection layer on the metal pattern to have a width greater than the metal pattern along a shape of the metal pattern and only in the inactive area;

forming a transparent conductive layer across the active and inactive areas thereon before the providing the ink material; and providing the ink material on the transparent conductive layer to form the metal pattern.

14. The method according to claim 13, wherein the specific vacuum condition includes use of a pressure lower than atmospheric pressure to allow the solvent to evaporize at a lower temperature than a boiling temperature of the solvent at atmospheric pressure.

15. The method according to claim 14, wherein the specific vacuum condition includes use of a temperature equal to or higher than a boiling point of the solvent at the pressure of the specific vacuum condition.

16. The method according to claim 15, wherein the temperature of the specific vacuum condition is lower than 130° C.

17. The method according to claim 13, wherein removing the solvent includes discharging a gas-state polar organic material vaporized from the solvent.

18. The method according to claim 13, wherein the conductive particles is made of at least one among silver (Ag), copper(Cu), and chromium(Cr).

19. The method according to claim 13, wherein the ink material further includes an organic material having a higher boiling point than a boiling point of the solvent.

20. The method according to claim 13, wherein a sheet resistance of the metal pattern is smaller than that of the transparent conductive layer.

21. The method according to claim 13, wherein removing the solvent from the ink material involves a removal process of a plurality of pores included in the ink material that the removal process includes increasing the volume of the pore and exposing the increased pore through a surface of the ink material.

* * * * *